US012632629B2

(12) United States Patent
Guan et al.

(10) Patent No.: US 12,632,629 B2
(45) Date of Patent: May 19, 2026

(54) INTEGRATED CIRCUIT DYNAMIC CAPACITANCE MATCHING METHOD, SIMULATION EQUIPMENT, AND STORAGE MEDIUM

(71) Applicant: Zhuhai Chipoly Technology Ltd., Zhuhai (CN)

(72) Inventors: Zhong Guan, Zhuhai (CN); Zhoujie Wu, Zhuhai (CN)

(73) Assignee: Zhuhai Chipoly Technology Ltd., Zhuhai (CN)

( * ) Notice: Subject to any disclaimer, the term of this patent is extended or adjusted under 35 U.S.C. 154(b) by 665 days.

(21) Appl. No.: 18/134,040

(22) Filed: Apr. 13, 2023

(65) Prior Publication Data

US 2024/0311539 A1     Sep. 19, 2024

(30) Foreign Application Priority Data

Mar. 13, 2023     (CN) .......................... 202310239373.3

(51) Int. Cl.
G06F 30/3308 (2020.01)

(52) U.S. Cl.
CPC ................................ G06F 30/3308 (2020.01)

(58) Field of Classification Search
CPC ...... G06F 30/30; G06F 30/392; G06F 30/394; G06F 30/398; G06F 30/3308; G06F 30/367; G06F 30/39; G06F 30/33; G06F 30/36; G06F 30/38
USPC ........................................................ 716/100
See application file for complete search history.

(56) References Cited

U.S. PATENT DOCUMENTS

| | | | |
|---|---|---|---|
| 11,741,283 B1 * | 8/2023 | Visvardis | G06F 30/3308 |
| | | | 716/100 |
| 2009/0125851 A1 * | 5/2009 | Levy | G06F 30/367 |
| | | | 716/100 |

* cited by examiner

*Primary Examiner* — Paul Dinh

(57) ABSTRACT

The present disclosure discloses a method for dynamically matching capacitors in integrated circuits, a simulation device and a storage medium. The method includes obtaining a standard cell database, obtaining the circuit netlist data to be analyzed, dividing and forming multiple unit networks based on a single standard cell and the corresponding load circuit included in the circuit netlist data, identifying the standard cell model in the unit network, obtaining the corresponding pre-simulation data group from the standard cell database according to the standard cell model, simulating the unit network based on the pre-simulation data group, and obtaining the output voltage curve data and/or the output current curve data of the unit network.

8 Claims, 4 Drawing Sheets

The piecewise function that satisfies abs(Ipre-Is) < threshold

The piecewise function that does not satisfy abs(Ipre-Is) < threshold

INTEGRATED CIRCUIT DYNAMIC CAPACITANCE MATCHING METHOD, SIMULATION EQUIPMENT, AND STORAGE MEDIUM

TECHNICAL FIELD

The present disclosure relates to the field of integrated circuit simulation, particularly to an integrated circuit dynamic capacitance matching method, simulation equipment, and storage medium.

BACKGROUND

In order to improve production efficiency and reduce production costs, integrated circuits need to undergo simulation testing during the design process to detect whether the functions meet the requirements and other functional parameters. SPICE (Simulation Program with Integrated Circuit Emphasis) is a traditional circuit analysis tool used to predict the behavior and performance of circuits. It is widely used in circuit design, verification, and optimization. Subsequently, various companies developed SPICE-based software such as HSPICE, PSPICE, and VSPICE. SPICE establishes differential equations for circuits based on Kirchhoff's laws, discretizes the original differential equation system based on numerical integration methods, obtains a nonlinear equation system satisfied by the circuit at each operating point, and iteratively solves the nonlinear equation system using the Newton-Raphson method to obtain the voltage, current, and other parameters of each node in the circuit at that operating point. Then, it analyzes the delay, power consumption, voltage drop of the power supply, and other indicators of the circuit. Because it uses numerical solution methods, it has the advantage of high simulation accuracy.

However, since the 1980s, the scale of digital integrated circuits has been rapidly increasing following Moore's law, resulting in exponential growth in the time and memory space required for SPICE simulation. As a result, SPICE simulation has gradually become unsuitable for ultra-large-scale digital integrated circuits. Therefore, there is no longer a universal simulation software for ultra-large-scale digital integrated circuits. Instead, a series of EDA tools have emerged for different parameters of integrated circuits, such as PrimeTime, PrimePower, and RedHawk, etc.

These tools adopt different techniques for different parameters of integrated circuits. For example, for timing analysis of integrated circuits, the industry has NLDM (Non-Linear Delay Model), CCS (Composite Current Source Model) and ECSM (Effective Current Source Model) techniques. For power analysis of integrated circuits, the industry has SPA (Statistical Power Analysis) technology. For reliability analysis of integrated circuits, the industry has empirical formula technology based on FF (Fitting Function). However, sometimes the results of these methods have significant errors compared to the SPICE standard, and the errors are more significant under advanced manufacturing processes, which cannot meet the analysis needs of designers.

BRIEF SUMMARY

The present disclosure aims to solve at least one of the technical problems existing in the prior art. To this end, the present disclosure provides a set of integrated circuit current-voltage waveform simulation techniques called DCM (Dynamic Capacitance Matching), which is different from all the existing techniques (such as NLDM, CCS, ECSM, SPA, FF) and does not rely on real-time SPICE simulation. This technique predicts current waveforms by using the characterization library provided by the manufacturer (the current response of multiple fixed capacitors drivers) and uses symbolic computation to achieve fast and accurate results. This approach can be used for timing analysis, power analysis, voltage drop analysis, and other aspects of digital integrated circuits. The technique is also adaptable to advanced manufacturing processes and can achieve an accuracy of about 1% compared to SPICE, while greatly reducing the simulation time.

The present disclosure also proposes equipment and storage media that can simulate integrated circuits with high simulation speed and accuracy.

The integrated circuit dynamic capacitance matching method according to the first embodiment of the present disclosure includes:

S1: obtaining standard cell circuit netlist data and standard cell documentation data;

S2: obtaining the range of load capacitance values;

For each standard cell, executing steps S3 and S4:

S3: based on the standard cell circuit netlist data and standard cell documentation data, constructing a standard cell driving capacitance load model;

S4: simulating the standard cell driving capacitance load model based on the range of load capacitance values, obtaining output voltage values, output current values, time values, and load capacitance value data to form a pre-simulation data set for the standard cell;

S5: obtaining pre-simulation data sets for each standard cell to form a standard cell database;

S6: obtaining the netlist data for the circuit to be analyzed;

S7: based on the netlist data for the circuit to be analyzed, dividing it into multiple unit networks based on a unit network that includes a single standard cell and its corresponding load circuit;

S8: identifying the standard cell model in the unit network and obtaining the corresponding pre-simulation data set from the standard cell database;

S9: simulating the unit network based on the pre-simulation data set to obtain the output voltage curve data and/or output current curve data for the unit network.

According to the integrated circuit dynamic capacitance matching method of the present disclosure, at least the following beneficial effects are achieved: In integrated circuit design, to improve design efficiency, commonly used functional circuits are packaged into standard cells. By obtaining the standard cell's port structure from the standard cell circuit netlist data and the port function and trigger logic from the standard cell documentation data, it can be used. By using the standard cell circuit netlist data and the standard cell documentation data, the model of the standard cell driving capacitor load is constructed, and then the simulation is performed by setting the load capacitance value to obtain the pre-simulation data group of the output voltage value, output current value, and time value under that load capacitance value. By repeating the simulation process after changing the load capacitance value until the load capacitance value range is covered, the complete pre-simulation data group of the standard cell can be obtained, and the pre-simulation data groups of different standard cells form a standard cell database. The standard cell database contains the pre-simulation data results of the standard cell, which can be directly extracted and used in the subsequent specific circuit simulation, which is beneficial to improve the subsequent simulation efficiency.

By dividing the circuit netlist data to be analyzed into unit networks that include a single standard cell and its corresponding load circuit based on a benchmark, simulating the unit network can effectively reduce the complexity of simulation. At the same time, after identifying the standard cell model in the unit network, the pre-simulation data set in the standard cell database can be used to reduce the simulation complexity of the unit network, improve the simulation speed, and the pre-simulation data set in the standard cell database can be obtained from high-precision simulation tools such as SPICE engines, which is beneficial to improving the simulation accuracy of the unit network. By dividing the circuit into unit networks, simplifying the simulation complexity, and using the pre-simulation data set in the standard cell database to simulate the unit networks to obtain output voltage curve data and output current curve data, the simulation purpose can be achieved, which is beneficial to improving the simulation speed and accuracy and meeting the usage requirements.

According to some embodiments of the present disclosure, the steps of S9 include:

S901: Obtaining the voltage output range of a standard unit based on a pre-simulation data set;

S902: Obtaining the maximum circuit capacitance value based on the analyzed circuit netlist data;

S903: Selecting a set of simulation voltage values uniformly from the voltage output range based on a preset quantity value;

S904: Obtaining N simulation voltage values in ascending order based on the selected simulation voltage values;

S905: Setting a test capacitance value based on the maximum circuit capacitance value;

S906: Obtaining the time value and output current value corresponding to the Nth simulation voltage value from the pre-simulation data set based on the Nth simulation voltage value and test capacitance value;

S907: Constructing a second piecewise function based on the Nth simulation voltage value and time value and the first piecewise function when N>2, or constructing the second piecewise function based on the first and second simulation voltage values when N=2;

S908: Simulating the load circuit in the unit network based on the second piecewise function as the input voltage function to obtain the simulation current value corresponding to the Nth simulation voltage value;

S909: Comparing the output current value with the simulation current value; if the difference between the output current value and the simulation current value is less than a threshold value, recording the simulation voltage value, output current value, and time value as simulation data points; if the difference between the output current value and the simulation current value is greater than the threshold value, adjusting the test capacitance value and repeating steps S906, S907, S908, and S909;

S910: Increasing N by 1 and using the second piecewise function as the first piecewise function, repeating steps S904, S905, S906, S907, S908, S909, and S910 until N+1 is greater than the preset quantity value;

S911: Fitting all simulation data points to generate output voltage curve data and output current curve data.

According to some embodiments of the present disclosure, the steps of S908 include:

S9081: Obtaining a matrix file of the load circuit in the unit network using a nodal analysis algorithm;

S9082: Obtaining the driving point admittance function by solving the matrix file using a solving algorithm;

S9083: Obtaining the current output function based on the driving point admittance function and using the second piecewise function as the input voltage function;

S9084: Obtaining the simulation current value corresponding to the Nth simulation voltage value by substituting the corresponding time value into the current output function.

According to some embodiments of the present disclosure, in step S909, if the difference between the output current value and the simulated current value is less than a threshold value, it further includes: using the tested capacitance value as the equivalent capacitance value, recording the equivalent capacitance value and time value as equivalent capacitance data; after step S910, it further includes: fitting all the equivalent capacitance data to generate equivalent capacitance change curve data.

According to some embodiments of the present disclosure, adjusting the tested capacitance value in step S909 includes: comparing the simulated current value with the output current value, and determining the tested capacitance value based on the comparison result using binary search combined with the maximum circuit capacitance value and the historical tested capacitance value; increasing the tested capacitance value according to binary search when the simulated current value is less than the output current value; decreasing the tested capacitance value according to binary search when the simulated current value is greater than the output current value.

According to some embodiments of the present disclosure, step S9 further includes: parallel execution of simulation for each unit network, obtaining output voltage curve data and output current curve data for each unit network.

The simulation device of the second aspect embodiment of the present disclosure includes a processor and a memory, and the memory stores program data. The processor executes the program data to implement the integrated circuit dynamic capacitance matching method described above.

The storage medium of the third aspect embodiment of the present disclosure stores program data, and the program data can be executed to implement the integrated circuit dynamic capacitance matching method described above.

Additional aspects and advantages of the present disclosure will be partially described below, and some will become apparent from the following description or by practicing the present disclosure.

BRIEF DESCRIPTION OF THE FIGURES

The above and/or additional aspects and advantages of the present disclosure will become apparent and easy to understand from the following description of embodiments in conjunction with the accompanying drawings, in which.

DETAILED DESCRIPTION

Figure 1:
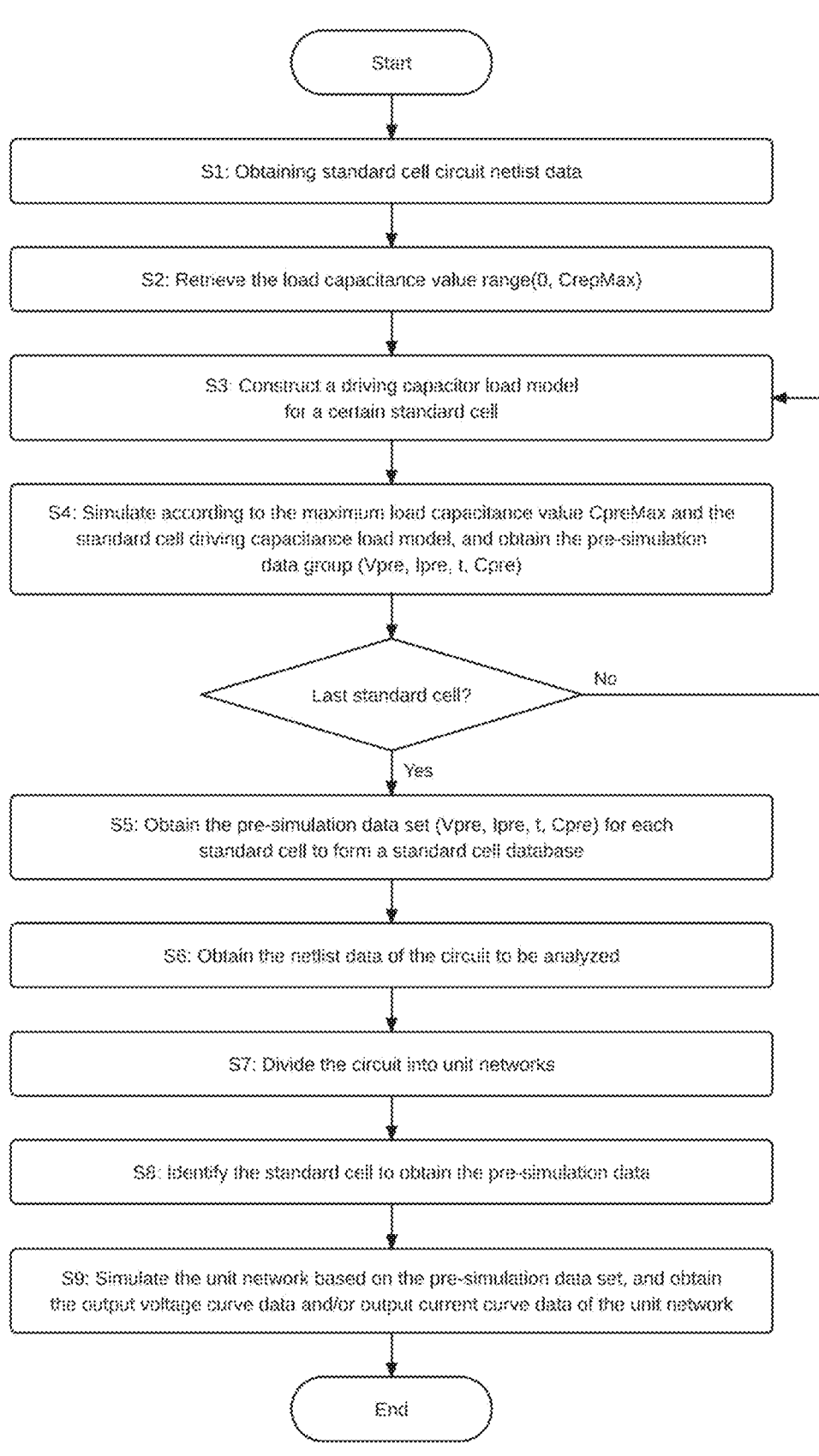
FIG. 1 is a flowchart of one embodiment of the present disclosure.

The specific embodiments of the present disclosure are described in detail below, and examples of the embodiments are shown in the accompanying drawings. The same or similar reference numerals throughout the specification denote the same or similar components or components having the same or similar functions. The following embodiments described with reference to the drawings are illustrative and explanatory of the present disclosure, and should not be construed as limiting the disclosure.

In the description of the present disclosure, it should be understood that the positional relationship such as "up," "down," "front," "rear," "left," "right," etc. indicated in the description is based on the positional relationship shown in the drawings, and is only for convenience of describing the present disclosure and simplifying the description. It should not be understood as indicating or implying that the apparatus or component referred to must have a specific orientation or be constructed and operated in a specific orientation, and thus should not be construed as limiting the present disclosure.

In the description of the present disclosure, if the terms "first" and "second" are used to distinguish technical features, it should not be understood as indicating or implying the relative importance of the technical features or the number or order of the technical features indicated.

In the description of the present disclosure, unless otherwise specified, words such as "set," "install," "connect," etc. should be understood in a broad sense, and those skilled in the art can reasonably determine the specific meanings of these words in the present disclosure based on the specific contents of the technical solution.

Figure 2:
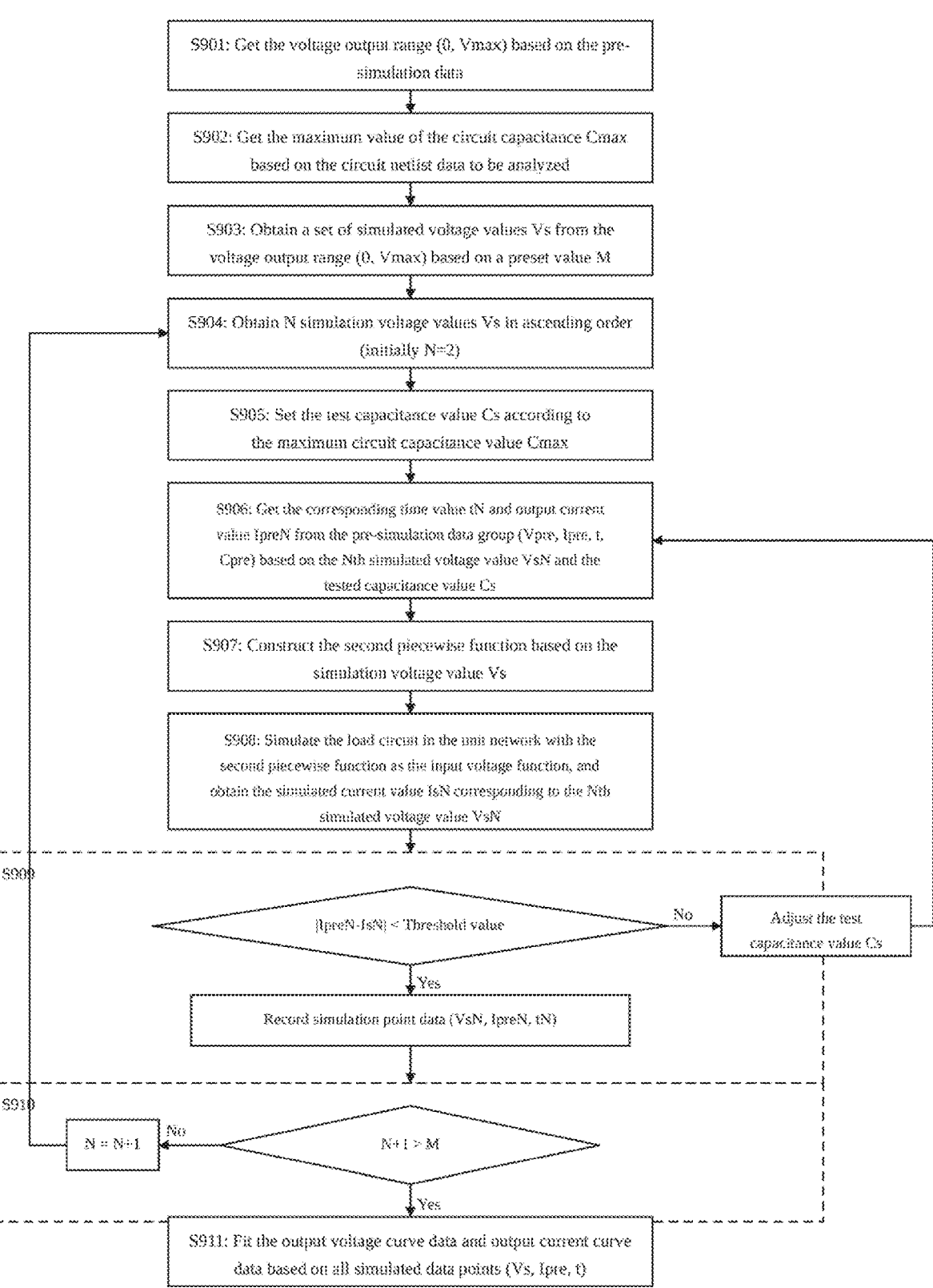
FIG. 2 is a flowchart of one embodiment of the present disclosure for simulating and generating output voltage curve data and/or output current curve data.

The following is a description of the process sequence of the integrated circuit dynamic capacitor matching method according to some embodiments of the present disclosure:

Referring to FIG. 2, the integrated circuit dynamic capacitor matching method according to some embodiments of the present disclosure includes:

S1: Obtaining standard cell circuit netlist data and standard cell documentation data;

S2: Obtaining the range of load capacitance values Cpre (0, CpreMax);

For each standard cell, executing steps S3 and S4:

S3: Constructing a standard cell driving capacitor load model based on the standard cell circuit netlist data and standard cell documentation data;

S4: Performing simulation based on the load capacitance value range (0, CpreMax) and the standard cell driving capacitor load model, obtaining the output voltage value Vpre, output current value Ipre, time value t, and load capacitance value Cpre data to form a standard cell pre-simulation data set (Vpre, Ipre, t, Cpre);

S5: Obtaining the pre-simulation data set (Vpre, Ipre, t, Cpre) for each standard cell to form a standard cell database.

In integrated circuit design, to improve design efficiency, commonly used functional circuits are packaged into standard cells. By obtaining the netlist data of the standard cell, the structure of each port can be known. By obtaining the description document data of the standard cell, the function and triggering logic of each port can be used without the need to design the same circuit from scratch repeatedly. This is conducive to improving the development efficiency of integrated circuits.

Based on the standard cell circuit netlist data and the standard cell description document data, a standard cell driving capacitor load model is constructed, and the model is simulated with a set load capacitance value Cpre. The pre-simulation data group (Vpre, Ipre, t, Cpre) obtained can be understood as the output voltage curve data and output current curve data of the standard cell driving capacitor load. The simulation process is repeated by changing the set load capacitance value Cpre until the load capacitance value range (0, CpreMax) is covered. Data groups for output voltage value Vpre, output current value Ipre, time value t, and corresponding load capacitance value Cpre can be obtained, forming a complete pre-simulation data group (Vpre, Ipre, t, Cpre) for the standard cell. Pre-simulation data groups (Vpre, Ipre, t, Cpre) for different standard cells form the standard cell database. The standard cell database contains the data results obtained by pre-simulating the standard cells, which can be directly extracted and used in subsequent simulations of specific circuits, improving simulation efficiency.

In some embodiments, the simulation data sets (Vpre, Ipre, t, Cpre) of different standard cells can be saved as text and separated into two characterization files: the first characterization file reflects the voltage and current during the rising edge, while the second characterization file reflects the current and voltage during the falling edge. The first and second characterization files can reflect the driving characteristics of the standard cells.

In some embodiments of the present disclosure, the SPICE engine is used for simulation in step S4. Specifically, during the simulation process of the standard cell driving capacitance load model, the SPICE engine is used in step S4, which can be software such as HSPICE and NGSPICE. Since the SPICE engine has high-precision simulation effects, it can make the pre-simulation data sets (Vpre, Ipre, t, Cpre) of the standard cells more accurate, and subsequently improve the accuracy of the simulation of the unit network, thereby improving the overall precision.

By simulating the standard cell driving capacitance load model, multiple pre-simulation data sets (Vpre, Ipre, t, Cpre) of the standard cells form a standard cell database. This process only needs to be performed once and can be applied to the simulation process of different integrated circuits. Although the SPICE engine is used for pre-simulation of the standard cells, since the circuit structure of the standard cells is not overly complex, the pre-simulation time using the SPICE engine is within an acceptable range. Furthermore, the standard cell database formed by pre-simulation can be reused, reducing simulation time and improving simulation speed and accuracy.

The standard cell database formed by pre-simulation using SPICE can be completed in advance and reused. For real-time simulation of specific circuits, the SPICE engine is not required, and satisfactory simulation results can still be obtained. The standard cell database can be stored on a server, and local devices can retrieve it from the server for real-time simulation.

During the simulation process, the range of the load capacitance value Cpre (0, CpreMax) can be taken sufficiently large to cover the common range of load capacitance. As shown in FIG. 1, the integrated circuit dynamic capacitance matching method of the present embodiment also includes:

S6: Obtaining the circuit netlist data to be analyzed;

S7: Based on the circuit netlist data to be analyzed, dividing it into multiple unit networks based on a single standard cell and the corresponding load circuit as a reference;

S8: Identifying the standard cell model in the unit network and obtaining the corresponding pre-simulation data group (Vpre, Ipre, t, Cpre) from the standard cell database according to the standard cell model;

S9: Simulating the unit network based on the pre-simulation data group (Vpre, Ipre, t, Cpre) to obtain the output voltage curve data and/or output current curve data of the unit network.

Dividing the circuit netlist data to be analyzed into unit networks that include a single standard cell and the corresponding load circuit as a reference can effectively reduce the simulation complexity of the unit networks. Meanwhile, identifying the standard cell model in the unit network and using the pre-simulation data group (Vpre, Ipre, t, Cpre) in the standard cell database can reduce the simulation complexity of the unit network, improve the simulation speed, and the pre-simulation data group (Vpre, Ipre, t, Cpre) in the standard cell database obtained by high-precision simulation tools such as SPICE engine is beneficial to improve the simulation accuracy of the unit network. Therefore, by dividing the circuit netlist data into unit networks and simplifying the simulation complexity, using the pre-simulation data group (Vpre, Ipre, t, Cpre) in the standard cell database to simulate the unit network, and obtaining the output voltage curve data and output current curve data of the unit network can achieve the simulation goal, improve simulation speed and accuracy, and meet the usage requirements.

In some embodiments of the present disclosure, as shown in FIG. 1, step S9 includes:

S901: Obtaining the voltage output range (0, Vmax) of the standard cell based on the pre-simulation data set (Vpre, Ipre, t, Cpre);

S902: Obtaining the maximum circuit capacitance value Cmax based on the circuit netlist data to be analyzed;

S903: Selecting a set of simulation voltage values Vs uniformly from the voltage output range (0, Vmax) based on a preset quantity value M;

S904: Obtaining N simulation voltage values Vs in ascending order based on the set of simulation voltage values Vs;

S905: Setting the test capacitance value Cs based on the maximum circuit capacitance value Cmax;

S906: Obtaining the time value tN and output current value IpreN corresponding to the Nth simulation voltage value VsN from the pre-simulation data set (Vpre, Ipre, t, Cpre) based on the Nth simulation voltage value VsN and the test capacitance value Cs;

S907: Constructing a second piecewise function using the first and second simulation voltage values Vs1 and Vs2 when N=2, and using the Nth simulation voltage value VsN and time value tN with the first piecewise function when N>2;

S908: Simulating the load circuit in the unit network using the second piecewise function as the input voltage function to obtain the simulation current value IsN corresponding to the Nth simulation voltage value VsN;

S909: Comparing the output current value IpreN with the simulation current value IsN; if the difference between the output current value IpreN and the simulation current value IsN is less than a threshold value, recording the simulation point data (VsN, IpreN, tN) as the simulation data; if the difference between the output current value IpreN and the simulation current value IsN is greater than the threshold value, adjusting the test capacitance value Cs and repeating steps S906, S907, S908, and S909;

S910: Setting N=N+1 and using the second piecewise function as the first piecewise function, repeating steps S904, S905, S906, S907, S908, S909, and S910 until N+1 is greater than the preset quantity value M;

S911: Fitting all simulation point data (Vs, Ipre, t) to generate output voltage curve data and output current curve data.

Based on the pre-simulation data set (Vpre, Ipre, t, Cpre), the maximum value of the standard cell output voltage Vmax can be obtained, and thus the voltage output range (0, Vmax) of the standard cell can be determined. For each unit network in the circuit to be analyzed, the capacitance values of the load circuits in each unit network are added together to obtain the network capacitance value, and the maximum network capacitance value is selected as the maximum circuit capacitance value Cmax. Based on the preset quantity value M, simulation voltage values Vs are taken from the voltage output range (0, Vmax), which includes multiple simulation voltage values Vs uniformly distributed in the voltage output range. In some embodiments, the voltage output range can be piecewise based on the preset quantity value M, with the endpoints of each piecewise being taken as the simulation voltage values Vs, for example: if the preset quantity value M is 100 and the voltage output range is (0, Vmax), the piecewise formed are (0, 1% Vmax); (1%, 2% Vmax) . . . (99% Vmax, Vmax); and the endpoints of each piecewise, i.e. 0, 1% Vmax, . . . . Vmax, are taken as the simulation voltage values Vs.

The model used to drive the load circuit in the unit network is a standard unit, so the output voltage of the standard unit is used as the input voltage of the load circuit during simulation, that is, the simulated voltage value Vs. Initially, N=2, which means that after obtaining two simulated voltage values Vs, the test capacitance value Cs is set. The test capacitance value Cs can be initially set to half of the maximum circuit capacitance Cmax, that is, ½Cmax. Based on the simulated voltage value Vs and the test capacitance value Cs, the second simulated voltage value Vs2 is taken as the output voltage value Vpre, and the test capacitance value Cs is taken as the load capacitance value Cpre. The corresponding time value t2 and the output current value Ipre2 are obtained from the pre-simulation data set (Vpre, Ipre, t, Cpre). A second piecewise function can be formed on the coordinate system by connecting the first simulated voltage value Vs1:0, the origin, and the second simulated voltage value Vs2 with the corresponding time value t2 using a straight line. The load circuit is simulated using the second piecewise function as the input voltage function, and the simulated current function is obtained. The simulated current value Is2 corresponding to the second simulated voltage value Vs2 is obtained by substituting the time value t2 into the simulated current function. If the difference between the output current value Ipre2 and the simulated current value Is2 is less than a threshold value, it can be considered that the equivalent capacitance value of the load circuit is equal to the test capacitance value Cs at this time, and the second piecewise function is the output voltage of the current state, and the simulated current is the output current of the current state. The corresponding second simulated voltage value Vs2, output current value Ipre2, and time value t2 are recorded as simulation point data (Vs2, Ipre2, t2). If the difference between the output current value Ipre2 and the simulated current value Is2 is greater than the threshold value, the test capacitance value Cs is adjusted, and the process of executing simulation steps S906, S907, S908, and S909 comparison processing is repeated with the test capacitance value Cs as the load capacitance value Cpre until the final test capacitance value Cs meets the requirements, and the simulation point data (Vs2, Ipre2, t2) is obtained.

After obtaining simulation data points (Vs2, Ipre2, t2) with N=2, the next set of simulation data points (Vs, Ipre, t) for N=3 must be obtained. The equivalent capacitance value of the load circuit changes with different input functions, so the final tested capacitance value Cs cannot be the same as the one used for N=2. To set the tested capacitance value Cs for N=3, the initial value can be set to half of the circuit's maximum capacitance value, i.e. ½Cmax. Using the third simulated voltage value Vs3 as the output voltage value Vpre, and the tested capacitance value Cs as the load capacitance value Cpre, the corresponding time value t3 and output current value Ipre3 can be obtained from the pre-simulation data set (Vpre, Ipre, t, Cpre). The second piecewise function used for N=2 will be used as the first piecewise function for N=3. The point formed by the third simulated voltage value Vs3 and the corresponding time value t3 will be connected to the endpoint of the first function formed by the second simulated voltage value Vs2 using a straight line. This forms a new second piecewise function, which will be used as the input voltage function for simulating the load circuit. The simulated current function can be obtained, and the corresponding simulated current value Is3 can be obtained by inputting the time value t3 corresponding to the third simulated voltage value Vs3 into the simulated current function. The S909 comparison processing step is executed to obtain the simulated data point (Vs3, Ipre3, t3) corresponding to the third simulated voltage value Vs3 and complete one iteration process. By repeating this process until N+1 is greater than the predetermined value M, i.e. all simulated voltage values Vs in the set have been obtained, a set of simulated data points (Vs, Ipre, t) with a quantity equal to the predetermined value M can be obtained. Based on the simulated data point set (Vs, Ipre, t), multiple points (Vs, t) formed by multiple simulated voltage values Vs and time values t can be obtained. Using this, a multi-point curve fitting can be performed to obtain output voltage curve data. Similarly, multiple points (Ipre, t) formed by multiple output current values Ipre and time values t can be obtained from the simulated data point set (Vs, Ipre, t), and a multi-point curve fitting can be performed to obtain output current curve data.

Figure 4:
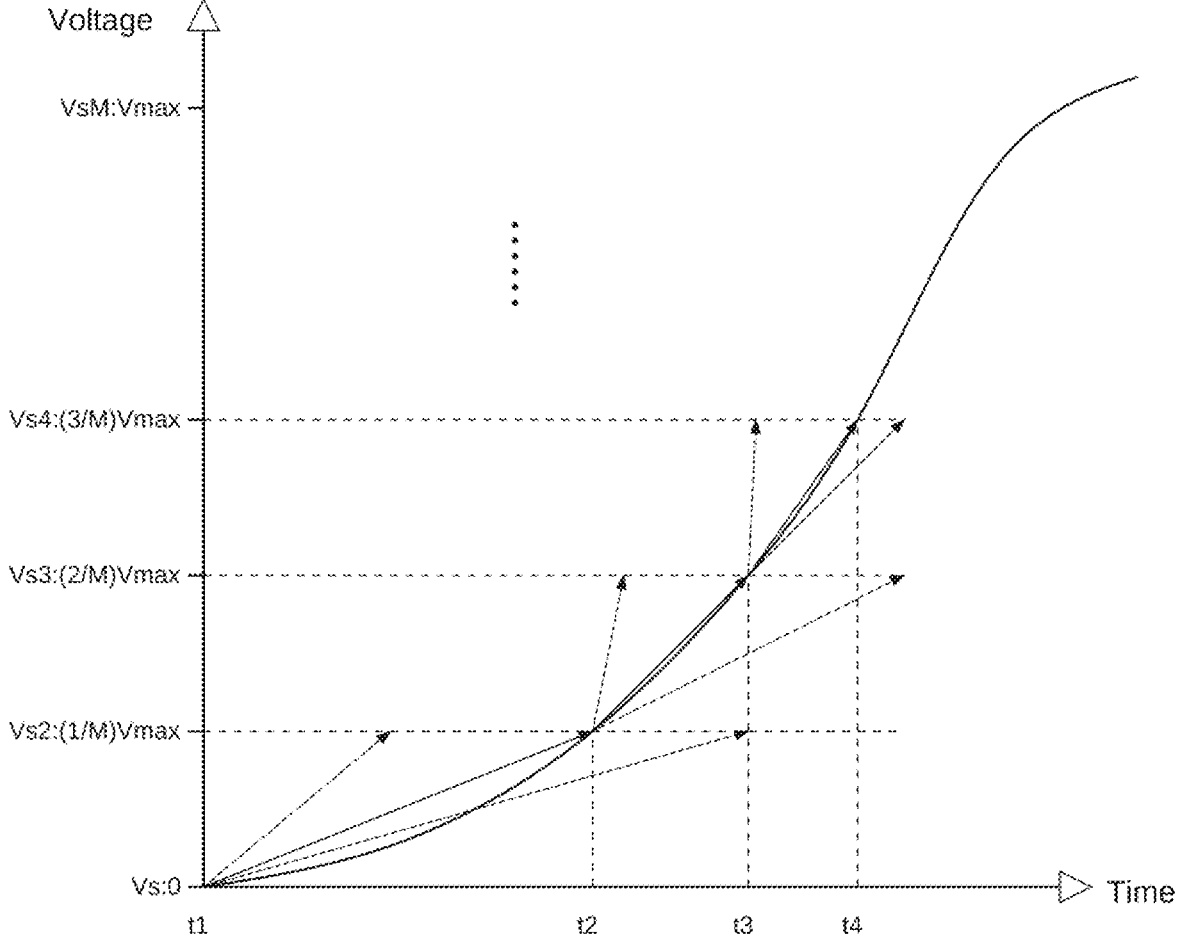
FIG. 4 is a schematic diagram of the formation of the second piecewise function in one embodiment of the present disclosure.
Figure 4:
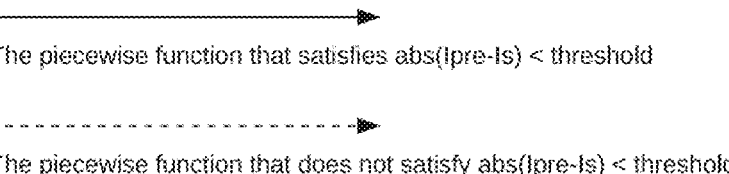

Referring to FIG. 4, as one embodiment of the present disclosure, a schematic diagram of the second piecewise function is constructed. The horizontal axis represents time and the vertical axis represents voltage. Multiple solid arrow lines are connected to form a complete second piecewise function. In the process of constructing the second piecewise function, when the initial N=2, the voltage range corresponding to (0, (1/M) Vmax) is considered. The dashed arrow and the solid arrow in the figure represent the second piecewise function corresponding to different tested capacitance values Cs and the simulated voltage value Vs. The dashed arrow represents the case where the difference between the output current value Ipre and the simulated current value Is corresponding to this second piecewise function as the simulated voltage value Vs is greater than the threshold value, indicating that the tested capacitance value Cs corresponding to this second piecewise function is not the equivalent capacitance value of the circuit at this time, and the error of this second piecewise function is large. The solid arrow means that when this second piecewise function is used as the simulated voltage value Vs, the difference between the output current value Ipre and the simulated current value Is is less than the threshold value, indicating that the tested capacitance value Cs corresponding to this second piecewise function is approximately equal to the equivalent capacitance value, and the accuracy of this second piecewise function meets the requirements.

Referring to FIG. 4, in the process of constructing the second piecewise function, when N=2, the second piecewise function is constructed based on the first simulated voltage value Vs1:0 and the second simulated voltage value Vs2: (1/M) Vmax, and the solid arrow in the figure is obtained as the second piecewise function. When N=3, the second piecewise function obtained from N=2 is used as the first piecewise function, that is, the solid arrow in the range of (0, (1/M) Vmax) is used as the first piecewise function, and then the second piecewise function is constructed based on the first piecewise function and the third simulated voltage value Vs3, resulting in two solid arrow piecewise in the range of (0, (2/M)Vmax) forming the second piecewise function. When N=4, the second piecewise function obtained from N=3 is used as the first piecewise function, and then the second piecewise function is constructed based on the first piecewise function and the fourth simulated voltage value Vs4. This process continues until N+1 is greater than the preset number value M, at which point all solid arrow lines form the complete second piecewise function.

It should be noted that even if the simulated voltage value Vs is equal, the corresponding time value t and output current value Ipre obtained from the pre-simulation data set (Vpre, Ipre, t, Cpre) may be different when the tested capacitance value Cs is different.

When comparing the output current value Ipre with the simulated current value Is, the threshold can be a numerical value or a percentage value, such as 1%. The percentage difference can be calculated by |Ipre−Is|/Ipre×100% or |Ipre−Is|/Is×100%.

Figure 3:
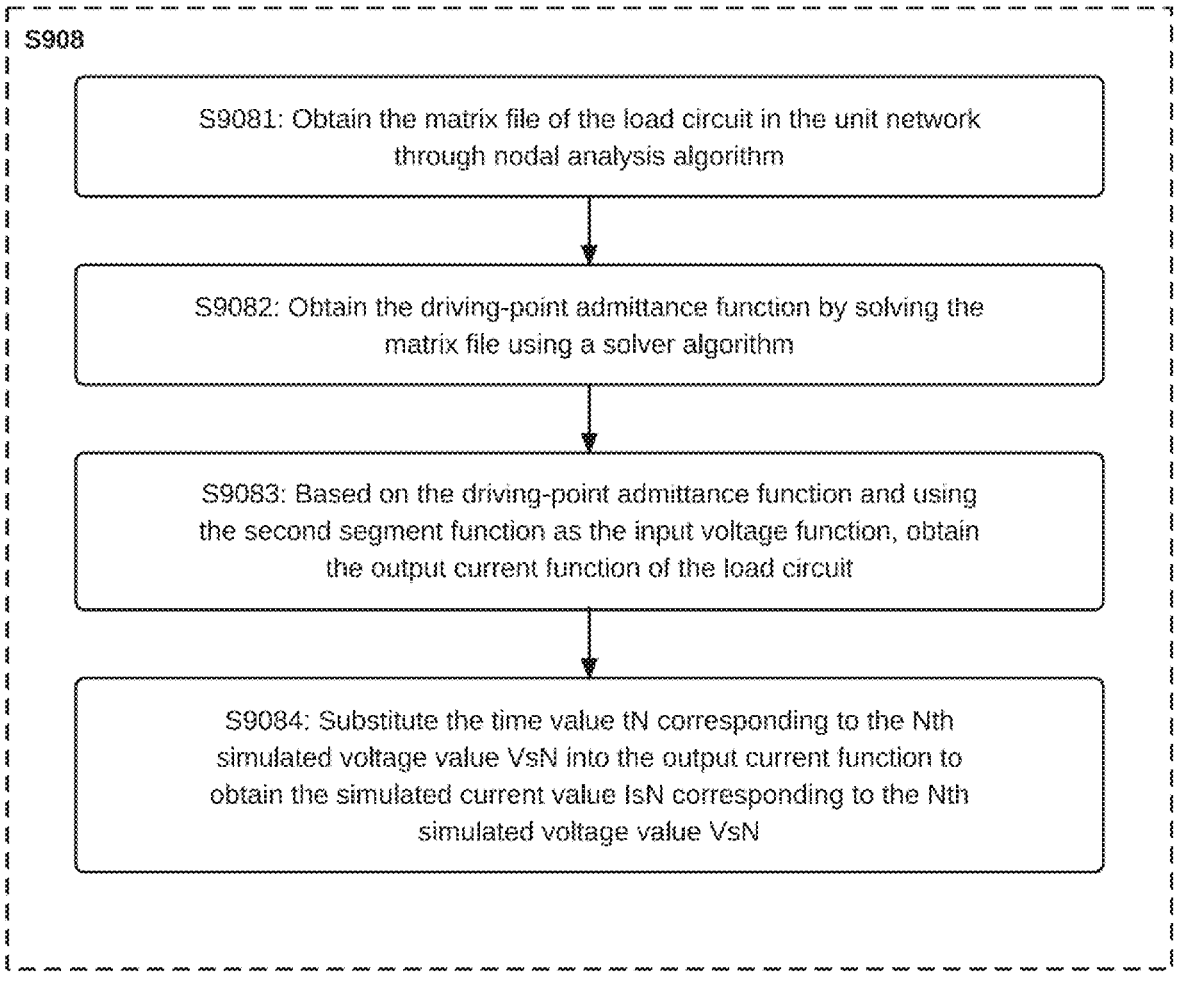
FIG. 3 is a flowchart of one embodiment of the present disclosure for simulating the load circuit in a unit network to obtain simulated current values.

Referring to FIG. 3, in some embodiments of the present disclosure, the steps of S908 may include:

S9081: Obtaining the matrix file of the load circuit in the unit network through node analysis algorithm;

S9082: Obtaining the driving point admittance function from the matrix file through solving algorithm;

S9083: Obtaining the current output function based on the driving point admittance function and using the second piecewise function as the input voltage function;

S9084: Substituting the time value tN corresponding to the Nth simulated voltage value VsN into the current output function to obtain the simulated current value IsN corresponding to the Nth simulated voltage value VsN.

The load circuit can be obtained through common node analysis algorithms such as MNA algorithm, and the matrix file can be obtained by solving algorithms such as PRIMA and SPRIM. The driving point admittance function can be used to obtain the input current at the input point according to the voltage at the network input point. By combining the second piecewise function as the input function with the driving point admittance function, the current output function can be obtained. Therefore, the simulated current value IsN corresponding to the Nth simulated voltage value VsN can be obtained based on the time value tN corresponding to the Nth simulated voltage value VsN.

To obtain the simulated current value Is more efficiently, symbolic expression can be used for numerical calculation. Since the second piecewise function reflecting the simulated voltage value Vs has a fixed form and the driving point admittance function obtained by circuit interconnection solution algorithm is also fixed, multiplying the second piecewise function and the driving point admittance function after Laplace transformation gives the complex frequency domain function of the simulated current. By performing Laplace inverse transformation on the complex frequency domain function of the simulated current, the time domain expression of the simulated current can be obtained, which also has a fixed form. Based on the above fixed form characteristics, the symbolic expression of the simulated current can be obtained through computer algorithm computation. The second piecewise function and the driving point admittance function can be substituted into the symbolic expression to obtain the time domain function of the simulated current without Laplace transformation, thereby improving computational efficiency. The symbolic expression can be obtained through symbolic calculation using the Sympy mathematical symbol calculation library in Python language. Mathematical symbol calculation can handle symbolic calculation of numerical representations, which means that mathematical objects are represented accurately rather than approximately, which is advantageous for improving accuracy.

In one embodiment of the present disclosure, the symbolic expression corresponding to the time domain function of the simulated current can be:

$$i(t) = \sum_{j=1}^{q}\sum_{i=1}^{N-1}\frac{res_j k_i}{pole_j}\left(\left(pole_j(t-t_i) - e^{(t-t_i)pole_j} + 1\right)u(t-t_i) - \right.$$
$$\left(pole_j(t-t_{i+1}) - e^{(t-t_{i+1})pole_j} + 1\right)u(t-t_{i+1})\right) +$$
$$\sum_{j=1}^{q}\sum_{i=1}^{N-1}res_j\left(v_i(1-e^{t-t_i})u(t-t_i) - v_{i+1}\left(1-e^{t-t_{i+1}}\right)u(t-t_{i+1})\right)$$

Wherein: $i(t)$ represents the simulated current value Is; $k$ represents the slope of each piecewise in the second piecewise function; $t$ represents the time value; res represents the residue pole, which appears in pairs with pole and can be obtained from the driving point admittance function; $q$ represents the order of model reduction, and the higher the $q$, the higher the accuracy; $u(t)$ represents the step function; $v$ represents the simulated voltage value Vs.

In some embodiments of the present disclosure, the step S909 of adjusting the test capacitance value Cs includes: comparing the simulated current value Is with the output current value Ipre, and determining the test capacitance value Cs based on the comparison result using binary search combined with the maximum circuit capacitance value Cmax and the historical test capacitance value Cs. When the simulated current value Is is less than the output current value Ipre, the test capacitance value Cs is increased according to the binary search; when the simulated current value Is is greater than the output current value Ipre, the test capacitance value Cs is decreased according to the binary search.

In some embodiments of the present disclosure, in the comparison and processing step S909, if the difference between the output current value Ipre and the simulated current value Is is smaller than a threshold value, it further includes: recording the test capacitance value Cs as the equivalent capacitance value, and recording the equivalent capacitance value and the corresponding time value t as the equivalent capacitance data; after step S910, it further includes: fitting all equivalent capacitance data to generate equivalent capacitance variation curve data.

Since the test capacitance value Cs can be considered equal to the equivalent capacitance value of the current state of the load circuit when the difference between the output current value Ipre and the simulated current value Is is smaller than the threshold value, the test capacitance value Cs is recorded as the equivalent capacitance value combined with the corresponding time value t to obtain multiple sets of equivalent capacitance data (Cs, t) through iteration. Based on this, the equivalent capacitance variation curve data can be fitted to reflect the change of the equivalent capacitance value, which is beneficial for reflecting more simulation parameters.

In some embodiments of the present disclosure, in step S9 of simulating the unit network based on the pre-simulation data set (Vpre, Ipre, t, Cpre) to obtain the output voltage curve data and/or output current curve data of the unit network, it further includes: parallel simulation of each unit network to obtain the output voltage curve data and output current curve data of each unit network.

The simulation of a single unit network needs to be executed in series to finally obtain the output voltage curve data and output current curve data. Multiple unit networks are simulated in parallel to improve simulation efficiency.

Through the above-described method for fast and efficient simulation of large-scale integrated circuits, the transient analysis of current can be completed for large-scale integrated circuits within an acceptable time frame, and the simulation speed is significantly faster than that of SPICE engines for the entire large-scale integrated circuit. Additionally, the number of simulated voltage values included in the simulation voltage value set Vs can be customized by setting a preset value M according to actual needs, which can adjust the simulation speed and accuracy. The higher the preset value M, the higher the simulation accuracy, and the lower the preset value M, the faster the simulation speed.

According to the second aspect of the embodiments of the present disclosure, the simulation device includes a processor and a memory, wherein the memory stores program data, and the processor executes the program data to implement the dynamic capacitance matching method for integrated circuits described above.

The processor in the simulation equipment executes program data stored in memory and can utilize pre-simulation data results from a standard cell database for direct extraction and use in subsequent specific circuit simulations, which can improve simulation efficiency. Using a benchmark that includes a single standard cell and a corresponding load circuit, the analyzed circuit netlist data is partitioned to form a unit network consisting of a single standard cell and its corresponding load circuit. Simulating the unit network can effectively reduce simulation complexity. By identifying the standard cell model in the unit network, the pre-simulation data set (Vpre, Ipre, t, Cpre) in the standard cell database can be used to reduce simulation complexity, improve simulation speed, and enhance simulation accuracy. The pre-simulation data set (Vpre, Ipre, t, Cpre) can be obtained from high-precision simulation tools such as the SPICE engine, which can improve the accuracy of the unit network simulation. Therefore, by partitioning the circuit to form unit networks, simplifying the simulation complexity, and utilizing the pre-simulation data set (Vpre, Ipre, t, Cpre) in the standard cell database to simulate the unit network, the output voltage and current curve data of the unit network can be obtained to achieve the simulation purpose, which can improve simulation speed and accuracy and meet the user's requirements.

The storage medium of the third embodiment of the present disclosure stores program data that can be executed to implement the integrated circuit dynamic capacitance matching method as described above.

The storage medium is connected to devices such as computers, and the program data stored and executed can utilize pre-simulation data results from a standard cell database for direct extraction and use in subsequent specific circuit simulations, which can improve simulation efficiency. Using a benchmark that includes a single standard cell and a corresponding load circuit, the analyzed circuit netlist data is partitioned to form a unit network consisting of a single standard cell and its corresponding load circuit. Simulating the unit network can effectively reduce simulation complexity. By identifying the standard cell model in the unit network, the pre-simulation data set (Vpre, Ipre, t, Cpre) in the standard cell database can be used to reduce simulation complexity, improve simulation speed, and enhance simulation accuracy. The pre-simulation data set (Vpre, Ipre, t, Cpre) can be obtained from high-precision simulation tools such as the SPICE engine, which can improve the accuracy of the unit network simulation. Therefore, by partitioning the circuit to form unit networks, simplifying the simulation complexity, and utilizing the pre-simulation data set (Vpre, Ipre, t, Cpre) in the standard cell database to simulate the unit network, the output voltage and current curve data of the unit network can be obtained to achieve the simulation purpose, which can improve simulation speed and accuracy and meet the user's requirements.

The various technical features of the embodiments described above can be combined in any way. To make the description concise, not all possible combinations of these technical features in the above embodiments are described. However, as long as the combination of these technical features does not contradict each other, they should all be considered within the scope of this specification.

Of course, the present disclosure is not limited to the above embodiments, and those skilled in the art can make equivalent modifications or substitutions without departing from the spirit of the present disclosure. These equivalent modifications or substitutions are also included within the scope of the claims of the present application.

What is claimed is:

1. Method for dynamic capacitance matching of integrated circuits, comprising:

S1: obtaining data of standard cell circuit netlist and standard cell specification document;

S2: obtaining a range of load capacitance values;

For each standard cell, executing steps S3 and S4:

S3: based on the data of the standard cell circuit netlist and the standard cell specification document, constructing a standard cell driver capacitance load model;

S4: simulating the standard cell driver capacitance load model based on the range of load capacitance values to obtain output voltage, output current, time, and load capacitance value data, forming a pre-simulation data set for the standard cell;

S5: obtaining pre-simulation data set for each standard cell to form a standard cell database;

S6: obtaining netlist data of circuit to be analyzed;

S7: based on the netlist data of the circuit to be analyzed, dividing the netlist data of the circuit into multiple unit networks based on a single standard cell and corresponding connected load circuit as a reference;

S8: identifying the standard cell driver capacitance load model in a unit network and obtaining the corresponding pre-simulation data set from the standard cell database based on the standard cell driver capacitance load model;

S9: simulating the unit network based on the pre-simulation data set to obtain output voltage curve data and/or output current curve data of the unit network.

2. The method for dynamic capacitance matching of integrated circuits according to claim 1, wherein step S9 comprises:

S901: obtaining the voltage output range of the standard cell based on the pre-simulation data set;

S902: obtaining the maximum circuit capacitance value from the circuit netlist data to be analyzed;

S903: uniformly selecting a set of simulation voltage values from the voltage output range based on a predetermined quantity;

S904: obtaining N simulation voltage values in ascending order based on the set of simulation voltage values;

S905: setting a test capacitance value based on the maximum circuit capacitance value;

S906: obtaining the time value and output current value corresponding to the Nth simulation voltage value and the test capacitance value from the pre-simulation data set;

S907: constructing a second piecewise function based on the Nth simulation voltage value and the time value when N>2, and based on the first and second simulation voltage values when N=2;

S908: simulating the load circuit in the unit network based on the second piecewise function as the input voltage function to obtain the simulated current value corresponding to the Nth simulation voltage value;

S909: comparing the output current value with the simulated current value; if the difference between the output current value and the simulated current value is less than a threshold value, recording the simulation voltage value, output current value, and time value as simulation point data; if the difference between the output current value and the simulated current value is greater than the threshold value, adjusting the test capacitance value and repeating steps S906, S907, S908, and S909;

S910: incrementing N by 1 and using the second piecewise function as the first piecewise function, and repeating steps S904, S905, S906, S907, S908, S909, and S910 until N+1 is greater than the predetermined quantity;

S911: fitting all simulation point data to generate output voltage curve data and output current curve data.

3. The integrated circuit dynamic capacitance matching method according to claim 2, wherein the S908 step includes:

S9081: obtaining a matrix file of the load circuit in the unit network through nodal analysis algorithm;

S9082: obtaining the driving-point admittance function by solving the matrix file through a solving algorithm;

S9083: obtaining the current output function based on the driving-point admittance function and using the second piecewise function as the input voltage function;

S9084: obtaining the simulated current value corresponding to the Nth simulated voltage value by substituting the time value corresponding to the Nth simulated voltage value into the current output function.

4. The integrated circuit dynamic capacitance matching method according to claim 2, wherein:

in the step S909, if the difference between the output current value and the simulated current value is less than a threshold value, the method further includes: using the test capacitance value as the equivalent capacitance value, recording the equivalent capacitance value and time value as the equivalent capacitance data;

after the step S910, the method further includes: fitting all the equivalent capacitance data to generate equivalent capacitance variation curve data.

5. According to claim 2 of the integrated circuit dynamic capacitor matching method, the feature of the method is that in step S909, the adjustment of the test capacitance value includes:

comparing the simulated current value with the output current value, determining the test capacitance value by using the binary search method combined with the circuit capacitance maximum value and historical test capacitance values based on the comparison result;

when the simulated current value is less than the output current value, increasing the test capacitance value based on the binary search method;

when the simulated current value is greater than the output current value, decreasing the test capacitance value based on the binary search method.

6. The dynamic capacitance matching method for integrated circuits according to claim 1, characterized in that in step S9, parallel simulation is performed on each unit network to obtain output voltage curve data and output current curve data for each unit network.

7. A simulation device comprising a processor and a memory, wherein the memory stores program data, and the processor executes the program data to implement:

S1: obtain data of standard cell circuit netlist and standard cell specification document;

S2: obtain a range of load capacitance values;

For each standard cell, executing steps S3 and S4:

S3: based on the data of the standard cell circuit netlist and the standard cell specification document, construct a standard cell driver capacitance load model;

S4: simulate the standard cell driver capacitance load model based on the range of load capacitance values to obtain output voltage, output current, time, and load capacitance value data, forming a pre-simulation data set for the standard cell;

S5: obtain pre-simulation data set for each standard cell to form a standard cell database;

S6: obtain netlist data of circuit to be analyzed;

S7: based on the netlist data of the circuit to be analyzed, divide the netlist data of the circuit into multiple unit networks based on a single standard cell and corresponding connected load circuit as a reference;

S8: identify the standard cell driver capacitance load model in a unit network and obtaining the corresponding pre-simulation data set from the standard cell database based on the standard cell driver capacitance load model;

S9: simulate the unit network based on the pre-simulation data set to obtain output voltage curve data and/or output current curve data of the unit network.

8. A non-transitory storage medium storing computer-readable program data, characterized in that the computer-readable program data, when executed by a processor, implements:

S1: obtain data of standard cell circuit netlist and standard cell specification document;

S2: obtain a range of load capacitance values;

For each standard cell, executing steps S3 and S4:

S3: based on the data of the standard cell circuit netlist and the standard cell specification document, construct a standard cell driver capacitance load model;

S4: simulate the standard cell driver capacitance load model based on the range of load capacitance values to obtain output voltage, output current, time, and load capacitance value data, forming a pre-simulation data set for the standard cell;

S5: obtain pre-simulation data set for each standard cell to form a standard cell database;

S6: obtain netlist data of circuit to be analyzed;

S7: based on the netlist data of the circuit to be analyzed, divide the netlist data of the circuit into multiple unit networks based on a single standard cell and corresponding connected load circuit as a reference;

S8: identify the standard cell driver capacitance load model in a unit network and obtaining the corresponding pre-simulation data set from the standard cell database based on the standard cell driver capacitance load model;

S9: simulate the unit network based on the pre-simulation data set to obtain output voltage curve data and/or output current curve data of the unit network.

* * * * *